United States Patent
Naijo (10) Patent No.: US 9,165,978 B2
(45) Date of Patent: Oct. 20, 2015

(54) LIGHT EMITTING APPARATUS AND METHOD FOR FABRICATING THE SAME

(71) Applicant: Samsung Display Co., Ltd., Yongin, Gyeonggi-Do (KR)

(72) Inventor: Tsuyoshi Naijo, Suwon-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/015,778

(22) Filed: Aug. 30, 2013

(65) Prior Publication Data

US 2014/0110726 A1  Apr. 24, 2014

(30) Foreign Application Priority Data

Oct. 22, 2012 (KR) ........................ 10-2012-0117350

(51) Int. Cl.
- *H01L 27/15* (2006.01)
- *H01L 51/52* (2006.01)
- *H01L 27/32* (2006.01)

(52) U.S. Cl.
CPC ............ *H01L 27/156* (2013.01); *H01L 27/326* (2013.01); *H01L 27/3218* (2013.01); *H01L 51/52* (2013.01); *H01L 2251/5338* (2013.01); *H01L 2251/5361* (2013.01)

(58) Field of Classification Search
CPC .................................................. H01L 27/156
See application file for complete search history.

(56) References Cited

U.S. PATENT DOCUMENTS

| | | | |
|---|---|---|---|
| 4,597,635 A * | 7/1986 | Hoshikawa | 349/73 |
| 5,436,744 A * | 7/1995 | Arledge et al. | 349/150 |
| 7,977,688 B2 | 7/2011 | Kim | |
| 8,293,550 B2 | 10/2012 | Kim | |
| 2006/0043562 A1* | 3/2006 | Watanabe | 257/686 |
| 2006/0231842 A1* | 10/2006 | Hirakata et al. | 257/72 |
| 2006/0273304 A1* | 12/2006 | Cok | 257/40 |
| 2007/0159070 A1* | 7/2007 | Hu | 313/504 |
| 2008/0191632 A1 | 8/2008 | Lee | |
| 2009/0001391 A1 | 1/2009 | Ogihara et al. | |
| 2009/0230415 A1 | 9/2009 | Ide et al. | |
| 2010/0237780 A1 | 9/2010 | Kim | |
| 2011/0221789 A1 | 9/2011 | Ota | |

FOREIGN PATENT DOCUMENTS

| KR | 10-2006-0122601 A | 11/2006 |
|---|---|---|
| KR | 10-2009-0116101 A | 11/2009 |
| KR | 10-2009-0131553 A | 12/2009 |

* cited by examiner

*Primary Examiner* — Matthew Reames
(74) *Attorney, Agent, or Firm* — Robert E. Bushnell, Esq.

(57) ABSTRACT

A light emitting apparatus includes a substrate having a first substrate portion, a second substrate portion arranged parallel to the first substrate portion, and a connection portion connecting the first substrate portion and the second substrate portion to each other. A plurality of first light emitting elements is formed on the first substrate portion; and a plurality of second light emitting elements is formed on the second substrate portion.

19 Claims, 8 Drawing Sheets

LIGHT EMITTING APPARATUS AND METHOD FOR FABRICATING THE SAME

CROSS-REFERENCE TO RELATED APPLICATIONS

This application is based on and claims priority from Korean Patent Application No. 10-2012-0117350, filed on Oct. 22, 2012 in the Korean Intellectual Property Office, the disclosure of which is incorporated herein in its entirety by reference.

BACKGROUND OF THE INVENTION

1. Field of the Invention

The present invention relates to a light emitting apparatus and a method for fabricating the same, and more particularly to a light emitting apparatus that is used as a display device and a method for fabricating the same.

2. Description of the Related Art

A light emitting apparatus is used in a display device or an illumination device. For example, an organic light emitting diode (OLED) display device displays an image using light emitted from an organic light emitting layer disposed between two electrodes.

In a display device, resolution and luminance are important. In particular, it is known that it is not easy to provide an OLED display device that has high resolution due to the fabricating process thereof.

SUMMARY OF THE INVENTION

Accordingly, the present invention has been developed to solve the above-mentioned problems occurring in the prior art, and one problem to be solved by the present invention is to provide a light emitting apparatus having an increased light emission rate and increased resolution.

Another problem to be solved by the present invention is to provide a method for fabricating a light emitting apparatus having an increased light emission rate and increased resolution.

Additional advantages, subjects, and features of the invention will be set forth in part in the description which follows, and in part will become apparent to those having ordinary skill in the art upon examination of the following, or may be learned from practice of the invention.

In one aspect of the present invention, there is provided a light emitting apparatus, which includes: a substrate including a first substrate portion, a second substrate portion arranged in parallel to the first substrate portion, and a connection portion connecting the first substrate portion and the second substrate portion to each other; a plurality of first light emitting elements formed on the first substrate portion; and a plurality of second light emitting elements formed on the second substrate portion.

In another aspect of the present invention, there is provided a light emitting apparatus, which includes: a first substrate; a second substrate arranged parallel to the first substrate; a plurality of first light emitting elements formed on one surface of the first substrate that faces the second substrate; and a plurality of second light emitting elements formed on the other surface of the second substrate that faces the first substrate, a light emitting direction of the first light emitting elements and a light emitting direction of the second light emitting elements being equal to each other.

In still another aspect of the present invention, there is provided a light emitting apparatus, which includes: a first substrate; a second substrate arranged parallel to the first substrate; a plurality of first light emitting elements formed on one surface of the first substrate that faces the second substrate; and a plurality of second light emitting elements formed on one surface of the second substrate which is opposite to the other surface of the second substrate that faces the first substrate, a light emitting direction of the first light emitting elements and a light emitting direction of the second light emitting elements being equal to each other, and the second light emitting elements being arranged to cross the first light emitting elements.

In still another aspect of the present invention, there is provided a method for fabricating a light emitting apparatus, which includes: preparing a substrate that is divided into a first substrate portion and a second substrate portion; forming a plurality of first light emitting elements on the first substrate portion and forming a plurality of second light emitting elements on the second substrate portion; and arranging the second substrate portion so that the second substrate portion faces the first substrate portion in parallel by folding a boundary between the first substrate portion and the second substrate portion.

The detailed items of other embodiments are included in the detailed description and the drawings.

According to the embodiments of the present invention, at least the following effects can be achieved.

That is, since the light emitting elements are arranged to cross each other in a vertical direction and emit light in one direction, the luminance and resolution can be improved.

The effects according to the present invention are not limited to the contents as exemplified above, but more various effects are included in the specification of the present invention.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in obtaining a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements in various figures.

Although the terms "first", "second", and so forth are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments of the present invention will be described with reference to the accompanying drawings.

A light emitting apparatus according to embodiments of the present invention is an apparatus that emits light, and may be applied to a display device, such as an organic light emitting display device or an inorganic light emitting display device, and an illumination device. In the following embodiment, an organic light emitting display device is exemplified, but the present invention is not limited thereto.

Figure 1:
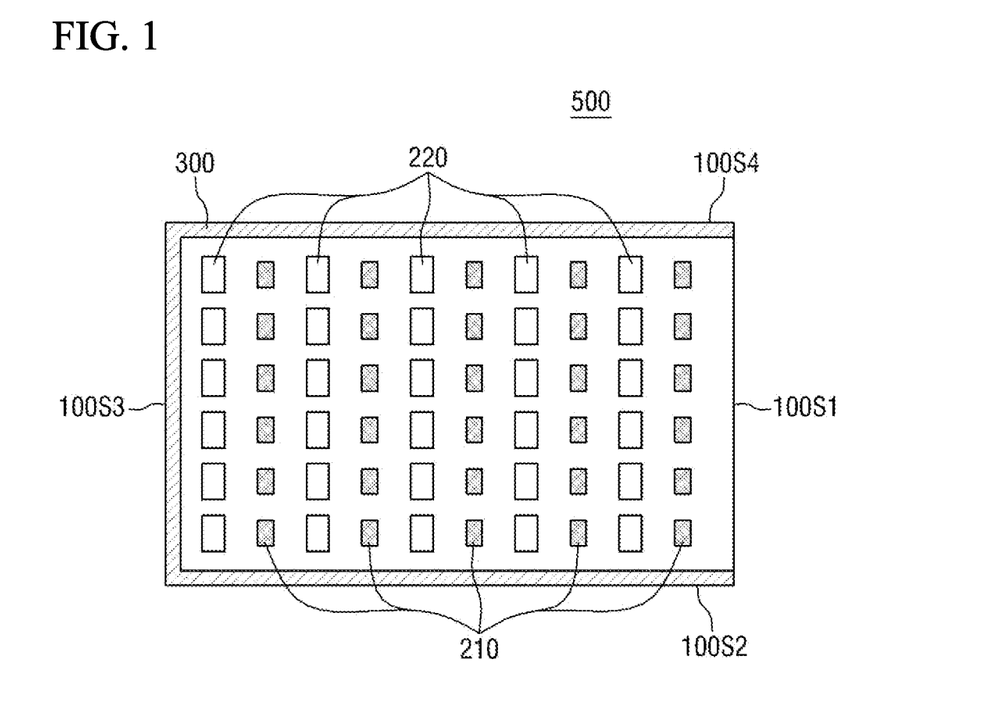
FIG. 1 is a schematic layout diagram of a light emitting apparatus according to an embodiment of the present invention.
Figure 2:
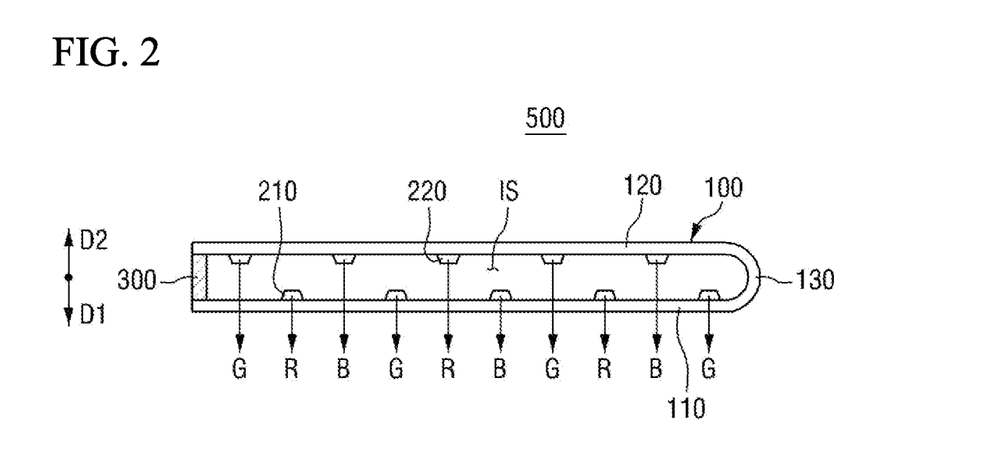
FIG. 2 is a schematic cross-sectional view of a light emitting apparatus according to an embodiment of the present invention.

FIG. 1 is a schematic layout diagram of a light emitting apparatus according to an embodiment of the present invention. FIG. 2 is a schematic cross-sectional view of a light emitting apparatus according to an embodiment of the present invention.

Referring to FIGS. 1 and 2, a light emitting apparatus 500 includes a substrate 100, a plurality of first light emitting elements 210 and a plurality of second light emitting elements 220, which are formed on the substrate 100.

The substrate 100 may be made of a transparent material. The substrate may be an insulating substrate, and a flexible substrate may be adopted as the substrate 100.

The center part of the substrate 100 is bent to provide two substrate portions 110 and 120. That is, the substrate 100 includes the first substrate portion 110 and the second substrate portion 120, which are arranged to be spaced apart from each other and to face each other in parallel, and a connection portion 130 connecting the first substrate portion 110 and the second substrate portion 120 to each other. In the exemplary embodiment, each of the first substrate portion 110 and the second substrate portion 120 may have a rectangular shape. Accordingly, each of the first substrate portion 110 and the second substrate portion 120 may include four side parts that correspond to respective sides of the rectangle. The first side part 100S1 of the first substrate portion 110 and the first side part 100s1 of the second substrate portion 120 may be connected to each other by the connection portion 130. The connection portion 130 may include a curved surface that is curved outwardly convexly.

The second side part 100S2, the third side part 100S3, and the fourth side part 100S4 of the first substrate portion 110 are spaced apart from the second side part 100S2, the third side part 100S3, and the fourth side part 100S4 of the second substrate portion 120, respectively, and a sealing member 300 such as sealant is interposed between them to seal a space between the first substrate portion 110 and the second substrate portion 120. That is, the sealing member 300 may be formed along the three side parts 100S2, 100S3 and 100S4 of the first substrate portion 110 and the second substrate portion 120.

An inner space IS of the light emitting apparatus 500 is defined between the first substrate portion 110 and the second substrate portion 120. One surface of the substrate 100 faces the inner space IS and the other surface of the substrate 100 faces in the outward direction that is opposite to the inner space. In the description, the surface of the substrate or the substrate portion that faces the inner space of the light emitting apparatus is defined as an inner surface, and the surface in the opposite direction is defined as an outer surface.

In the embodiment of FIG. 2, one surface of the substrate 100 becomes the inner surface of the substrate 100, and the other surface of the substrate 100 becomes the outer surface of the substrate 100. Furthermore, if it is assumed that a lower direction in FIG. 2 is a first direction D1 and an upper direction that is the opposite direction is a second direction D2, the inner surface of the first substrate portion 110 faces in the second direction D2, and the inner surface of the second substrate portion 120 faces in the first direction D1. The inner surface of the first substrate portion 110 and the inner surface of the second substrate portion 120 face each other.

A plurality of first light emitting elements 210 are formed on the inner surface of the first substrate portion 110, and a plurality of second light emitting elements 220 are formed on the inner surface of the second substrate portion 120. The first light emitting elements 210 and the second light emitting elements 220 perform unilaterally dominant light emission. Here, "unilaterally dominant light emission" means that the quantity of light emitted from the elements differs depending on the direction. That is, in the case where the quantity of light emitted to one side is larger than the quantity of light emitted to the other side, it may be called the unilaterally dominant light emission.

In an exemplary embodiment, the light from the light emitting element may be emitted only in one direction without being emitted in the other direction. In the case where the light emitting elements are formed on the upper surface of the substrate, the elements that emit light mainly in the upper direction of the substrate (the opposite direction of the substrate based on the light emitting elements) may be called front surface light emitting elements, and the elements that emit light in the lower direction of the substrate to penetrate the substrate may be called rear surface light emitting elements.

Referring to FIG. 2, the light emitted from the first light emitting elements 210 of the first substrate portion 110 and the light emitted from the second light emitting elements 220 of the second substrate portion 120 are all emitted in the first direction D1. Here, the first light emitting elements 210 are the rear surface light emitting elements since the light is emitted to penetrate the first substrate portion 110, and the second light emitting elements 220 are the front surface light emitting elements since the light is emitted to the upper part of the second substrate portion 120 on which the second light emitting elements 220 are formed. However, since the first substrate portion 110 and the second substrate portion 120 face each other, the rear surface direction of the first substrate portion 110 and the front surface direction of the second substrate portion 120 become the same direction. Accordingly, the light emitted from the first light emitting elements 210 and the light emitted from the second light emitting elements 220 are directed to the same direction. Accordingly, the total quantity of light emitted to the lower part of the light emitting apparatus can be calculated by summing the quantity of light emitted form the plurality of first light emitting elements 210 and the quantity of light emitted from the plurality of second light emitting elements 220. In another embodiment of the present invention, since the first light emitting elements 210 are the front surface light emitting elements and the second light emitting elements 220 are the rear surface light emitting elements, the light may be emitted to the upper part of the light emitting apparatus.

The first light emitting elements 210 are arranged so as to be apart from each other, and the second light emitting elements 220 are also arranged so as to be apart from each other. In the exemplary embodiment, the first light emitting elements 210 and the second light emitting elements 220 may be arranged to cross each other. That is, the first light emitting elements 210 may be arranged to overlap separation spaces between the plurality of second light emitting elements 220, and the second light emitting elements 220 may be arranged to overlap separation spaces between the plurality of first light emitting elements 210. FIG. 1 shows a planar layout of such an arrangement. Referring to FIG. 1, the plurality of first light emitting elements 210 are arranged in a first matrix shape, and the plurality of second light emitting elements are arranged in a second matrix shape. By making them overlap each other, an arrangement in a third matrix shape can be defined. The third matrix has a shape in which columns of the second matrix are arranged between columns of the first matrix. The number of rows and columns of the first matrix and the intervals thereof may be substantially the same as the number of rows and columns of the second matrix and the intervals thereof.

In an embodiment of FIG. 1, the first matrix is a 6×5 matrix, the second matrix is a 6×5 matrix, and the third matrix that is defined by making the first and second matrices overlap each other becomes a 6×10 matrix. If it is assumed that a first area S1 occupied by the first matrix is substantially the same as a second area S2 occupied by the second matrix, and a third area S3 occupied by the third matrix approximates the first area S1 and the second area S2, the third matrix has a denser arrangement in the column direction than the first and second matrices. If it is assumed that the light emitting apparatus is adopted in the display device and the respective light emitting elements correspond to pixels of the display device, the third matrix can realize higher resolution, for example, about twice the resolution of the first matrix or the second matrix.

Hereinafter, referring to FIGS. 3 and 4, the structures of the first light emitting element 210 and the second light emitting element 220 will be described in more detail.

Figure 3:
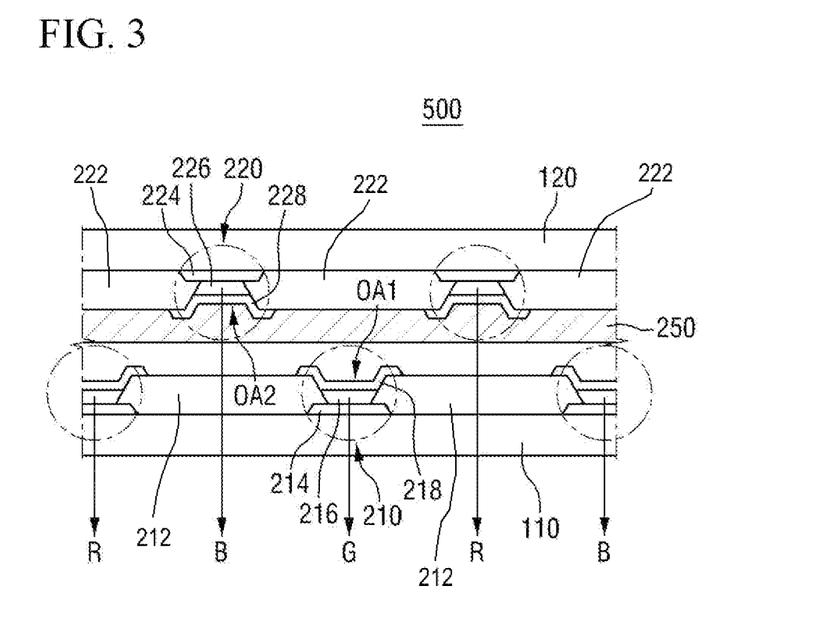
FIG. 3 is a partial cross-sectional view of a light emitting apparatus according to an embodiment of the present invention.

FIG. 3 is a partial cross-sectional view of a light emitting apparatus according to an embodiment of the present invention. FIG. 4 is a schematic view of light emitting elements of a light emitting apparatus according to an embodiment of the present invention.

Figure 4:
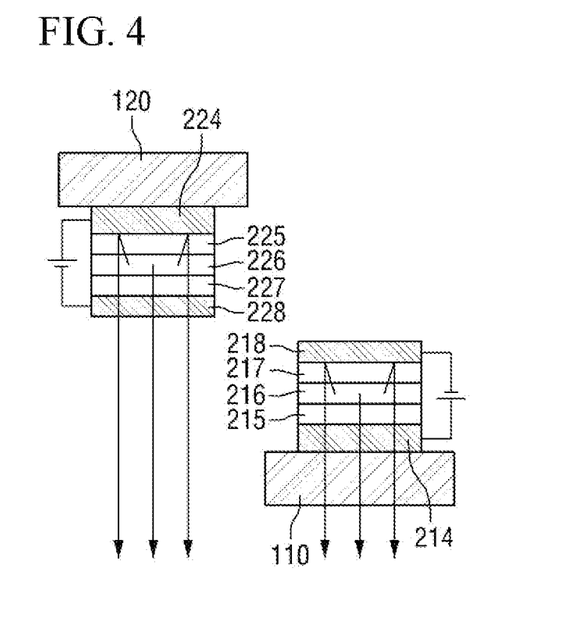
FIG. 4 is a schematic view of light emitting elements of a light emitting apparatus according to an embodiment of the present invention.

Referring to FIGS. 3 and 4, a first lower electrode 214 and a first pixel definition film 212 are formed on the first substrate portion 110. The first pixel definition film 212 defines a first opening OA1 that at least partly exposes the first lower electrode 214. On the first lower electrode 214 that is exposed by the first opening OA1, a first light emitting layer 216 is formed. On the first light emitting layer 216 and the first pixel definition film 212, a first upper electrode 218 is formed. In the description, for convenience in explanation, it is assumed that an electrode that is positioned on a relatively lower side based on the substrate is called the lower electrode, and an electrode that is positioned on a relatively upper side based on the substrate is called the upper electrode.

The first lower electrode 214 may be an anode electrode and the first upper electrode 218 may be a cathode electrode. In contrast, the first lower electrode 214 may be a cathode electrode and the first upper electrode 218 may be an anode electrode. The first lower electrode 214 may be a transparent electrode and the first upper electrode 218 may be an opaque electrode. Furthermore, the first upper electrode 218 may be a reflective electrode. In the exemplary embodiment, the first lower electrode 214 may be the anode electrode and may be formed of a conductive material having a high work function, for example, a material, such as ITO, IZO, ZnO, or $In_2O_3$, or a laminated film thereof. The first upper electrode 218 may be the cathode electrode and may be formed of a conductive material having a low work function, for example, Ag, Mg, Al, Pt, Pd, Au, Ni, Nd, Ir, Cr, Li, or Ca.

The first light emitting layer 216 may be made of a polymeric or low-molecular-weight organic material or a polymeric/low-molecular-weight mixture which inherently emits light of one of red (R), green (G), and blue (B). In some embodiments, the first light emitting layer 216 may be formed to include a host material and a dopant material.

If the first lower electrode 214 is the anode electrode, a hole injection layer, a hole transport layer, or a laminated film thereof or a hole injection/transport combination layer may be disposed between the first lower electrode 214 and the first light emitting layer 216 (see "215" in FIG. 4). If the first upper electrode 218 is the cathode electrode, an electron injection layer, an electron transport layer, or a laminated film thereof or an electron injection/transport combination layer may be disposed between the first upper electrode 218 and the first light emitting layer 216 (see "217" in FIG. 4).

The second substrate portion 120 is arranged to face the first substrate portion 110, and a second lower electrode 224 and a second pixel definition film 222 are formed on the second substrate portion 120 that faces on the first substrate portion 110. The second pixel definition film 222 defines a second opening OA2 that at least partly exposes the second lower electrode 224. On the second lower electrode 224 that is exposed by the second opening OA2, a second light emitting layer 226 is formed. On the second light emitting layer 226 and the second pixel definition film 222, a second upper electrode 228 is formed.

The second lower electrode 224 may be an anode electrode and the second upper electrode 228 may be a cathode electrode. By contrast, the second lower electrode 224 may be a cathode electrode and the second upper electrode 228 may be an anode electrode.

The second lower electrode 224 may include a reflective material. If the second lower electrode 224 is the anode electrode, the second lower electrode 224 may include a laminated film of a lower film made of a reflective material, such as Al, Ag, Cr, or Mo and an upper film made of a material having high work function, such as ITO, IZO, ZnO, or In$_2$O$_3$.

The second upper electrode 228 may be a transparent or semi-transparent electrode. If the second upper electrode 228 is the cathode electrode, the second upper electrode 228 may be formed by laminating metals having low work function, such as Ag, Mg, Al, Pt, Pd, Au, Ni, Nd, Ir, Cr, Lt, LiF, Ba, Ca, and a compound thereof, with a thickness where the light penetration is possible. Furthermore, in order to lower the resistance of the second upper electrode 228, a transparent conductive material, such as ITO, IZO, ZnO, or In$_2$O$_3$, may be further laminated on the metal film.

The second light emitting layer 226 may be made of a polymeric or low-molecular-weight organic material or a polymeric/low-molecular-weight mixture which inherently emits light of one of red (R), green (G), and blue (B). If the second lower electrode 224 is the anode electrode, a hole injection layer, a hole transport layer, or a laminated film thereof or a hole injection/transport combination layer may be disposed between the second lower electrode 224 and the second light emitting layer 226 (see "225" in FIG. 4). If the second upper electrode 228 is the cathode electrode, an electron injection layer, an electron transport layer, or a laminated film thereof or an electron injection/transport combination layer may be disposed between the second upper electrode 228 and the second light emitting layer 226 (see "227" in FIG. 4).

In the exemplary embodiment, the second light emitting layer 226 may be substantially the same as the first light emitting layer 216, and an interposer film 225 that is interposed between the second lower electrode 224 and the second light emitting layer 226 on the second substrate portion 120 may be the same as an interposer film 215 that is interposed between the first lower electrode 214 and the first light emitting layer 216 on the first substrate portion 110 as described above. An interposer film 227 that is interposed between the second upper electrode 228 and the second light emitting layer 226 on the second substrate portion 120 may be the same as an interposer film 217 that is interposed between the first upper electrode 218 and the first light emitting layer 216 on the first substrate portion 110 as described above.

The first pixel definition film 212 and the second pixel definition film 222 may be formed to include at least one organic material selected from benzocyclobutene (BCB), polyimide (PI), polyamaide (PA), acrylic resin, and phenol resin. The first pixel definition film 212 and the second pixel definition film 222 may be made of the same material.

On the second substrate portion 120, a buffer layer 250 that covers the second upper electrode 228 and the second pixel definition film 222 may be formed. The buffer layer 250 may be formed of a transparent organic film, a transparent inorganic film, or a laminated film thereof. The buffer layer 250 may serve to spatially separate the first substrate portion 110 and the second substrate portion 120 from each other, and to secure insulation between the first upper electrode 218 and the second upper electrode 228.

Referring to FIG. 4, if an electric field is formed between the first lower electrode 214 and the first upper electrode 218 of the first substrate portion 110, a predetermined light is emitted from the first light emitting layer 216. Since the first upper electrode 218 is a reflective electrode, the light passes through the first substrate portion 110 and is emitted in the lower direction in the drawing. In the same manner, if an electric field is formed between the second lower electrode 224 and the second upper electrode 228 of the second substrate portion 120, light is emitted from the second light emitting layer 226. Since the second lower electrode 224 on the second substrate portion 120 is a reflective electrode, the light is emitted in the lower direction in the drawing that is the direction opposite to the second substrate portion 120. Accordingly, the light of the first light emitting layer 216 and the light of the second light emitting layer 226 may both be emitted in the lower direction in the drawing.

Figure 5:
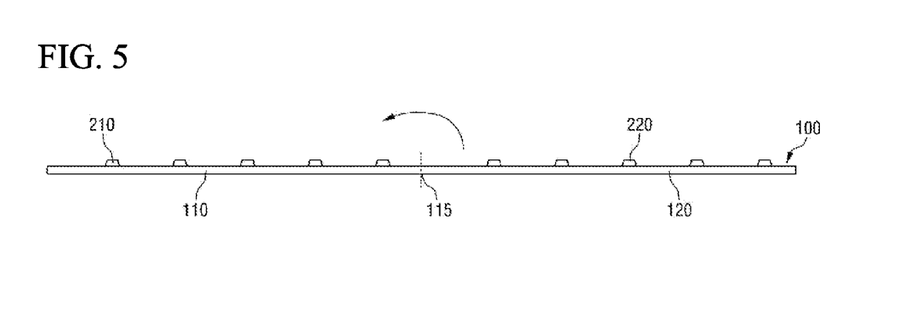
FIGS. 5 and 6 are schematic cross-sectional views for explaining a method for fabricating the light emitting apparatus of FIG. 2.
Figure 6:
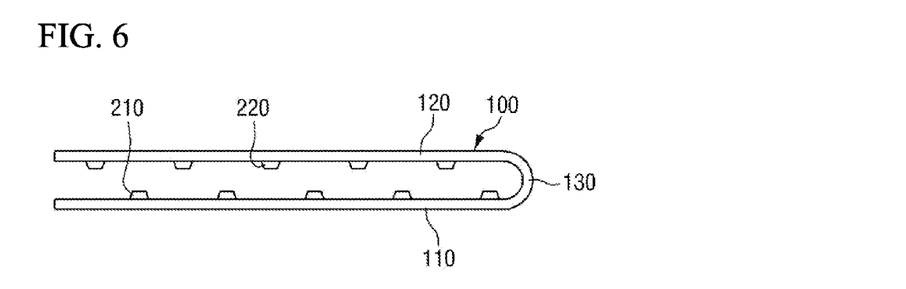

FIGS. 5 and 6 are schematic cross-sectional views for explaining a method for fabricating the light emitting apparatus of FIG. 2.

Referring to FIG. 5, first, the substrate is divided into the first substrate portion 110 and the second substrate portion 120. The plurality of first light emitting elements 210 are formed on the first substrate portion 110, and the plurality of second light emitting elements 220 are formed on the second substrate portion 120.

Referring to FIG. 6, the second substrate portion 120 is arranged to face the first substrate portion 110 in parallel by folding a boundary 115 (in FIG. 5) between the first substrate portion 110 and the second substrate portion 120. Then, the sealing member 300 is disposed along the three corresponding side parts 100S1, 100S2, and 100S3 (in FIG. 1) of the first substrate portion 110 and the second substrate portion 120 to complete the light emitting apparatus 500. In another embodiment, the light emitting apparatus 500 of FIG. 2 may be completed by coating the sealing member 300 on the three side parts 100S1, 100S2, and 100S3 (in FIG. 1) of the first substrate portion 300, and by then folding the second substrate portion 120.

FIGS. 7 to 11 are referred to in order to explain the method for fabricating the first light emitting elements 210 and the second light emitting elements 220 of FIG. 5 in more detail. FIGS. 7 to 11 are cross sectional views for explaining processing steps of the method for fabricating the light emitting apparatus of FIG. 3.

Figure 7:
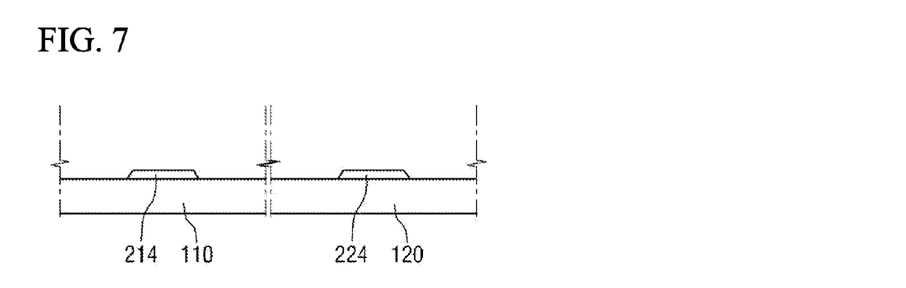
FIGS. 7 to 11 are cross sectional views for explaining processing steps of the method for fabricating the light emitting apparatus of FIG. 3.

Referring to FIG. 7, the first lower electrode 214 is formed on the first substrate portion 110 and the second lower electrode 224 is formed on the second substrate portion 120. If the first lower electrode 214 and the second lower electrode 224 are made of different materials, the first lower electrode 214 and the second lower electrode 224 may be separately formed through patterning processes, such as a mask process, a printing process, and an ink jet process.

Figure 8:
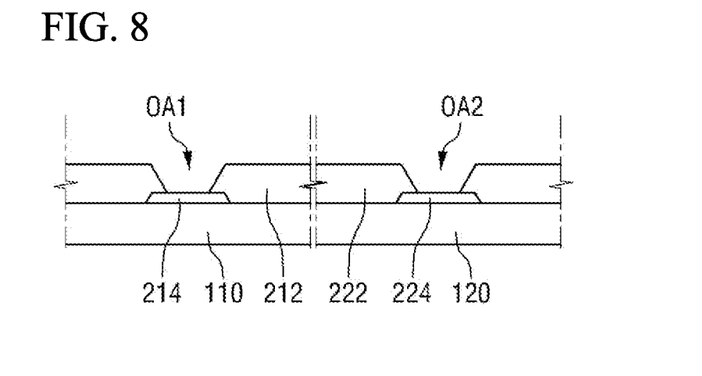

Referring to FIG. 8, the first pixel definition film 212, which defines the first opening OA1 that exposes the first lower electrode 214, is formed on the first substrate portion 110, and the second pixel definition film 222, which defines the second opening OA2 that exposes the second lower electrode 224, is formed on the second substrate portion 120. The first pixel definition film 212 that defines the first opening OA1 and the second pixel definition film 222 that defines the second opening OA2 may be formed of the same material, and may be simultaneously patterned using one mask.

Figure 9:
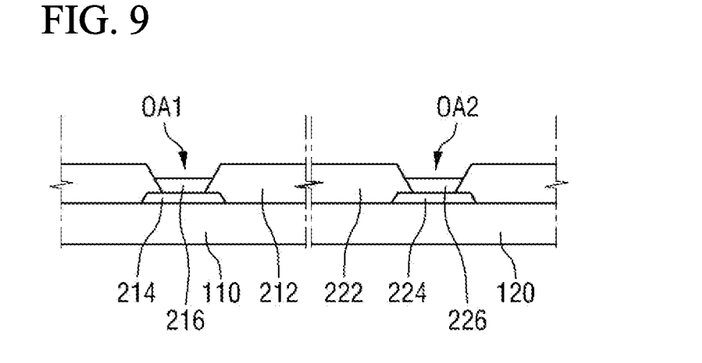

Referring to FIG. 9, the first light emitting layer 216 is formed on the first lower electrode 214 that is exposed by the first opening OA1, and the second light emitting layer 226 is formed on the second lower electrode 224 that is exposed by the second opening OA2. If the first light emitting layer 216 and the second light emitting layer 226 are made of the same material, they can be simultaneously formed.

On the other hand, before the first light emitting layer 216 and the second light emitting layer 226 are formed, a lower interposer film (see 215 and 225 in FIG. 4) of a hole injection layer, a hole transport layer, or a laminated film thereof or a hole injection/transport combination layer may be formed on the first lower electrode 214 and the second lower electrode 224. The lower interposer film may be simultaneously formed on the first substrate portion 110 and the second substrate portion 120. Furthermore, after the first light emitting layer 216 and the second light emitting layer 226 are formed, an upper interposer film (see 217 and 227 in FIG. 4) of an electron injection layer, an electron transport layer, or a laminated film thereof or an electron injection/transport combination layer may be formed. The upper interposer film may be simultaneously formed on the first substrate portion 110 and the second substrate portion 120.

Figure 10:
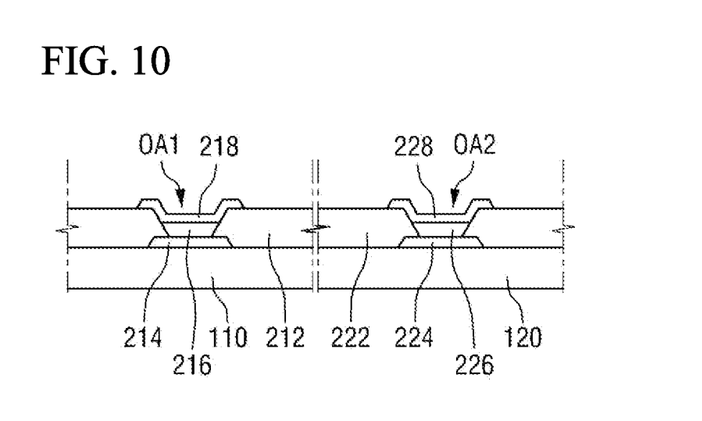

Referring to FIG. 10, the first upper electrode 218 is formed on the first light emitting layer 216, and the second upper electrode 228 is formed on the second light emitting layer 226. The first upper electrode 218 and the second upper electrode 228 may be separately formed through patterning processes, such as a mask process, a printing process, and an ink jet process.

Figure 11:
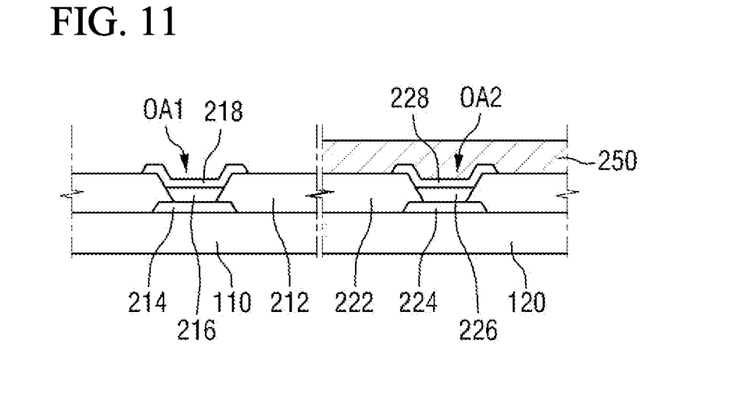

Referring to FIG. 11, on the second substrate portion 120, the buffer layer 250 that covers the second upper electrode 228 and the second pixel definition film 222 is formed. In continuation, the light emitting apparatus 500 is completed using the above-described method with reference to FIGS. 5 and 6.

Hereinafter, other embodiments of the present invention will be described. In the following embodiments, the same reference numerals are given to the same configurations as the already described configurations, and the duplicate explanation thereof will be omitted or simplified.

Figure 12:
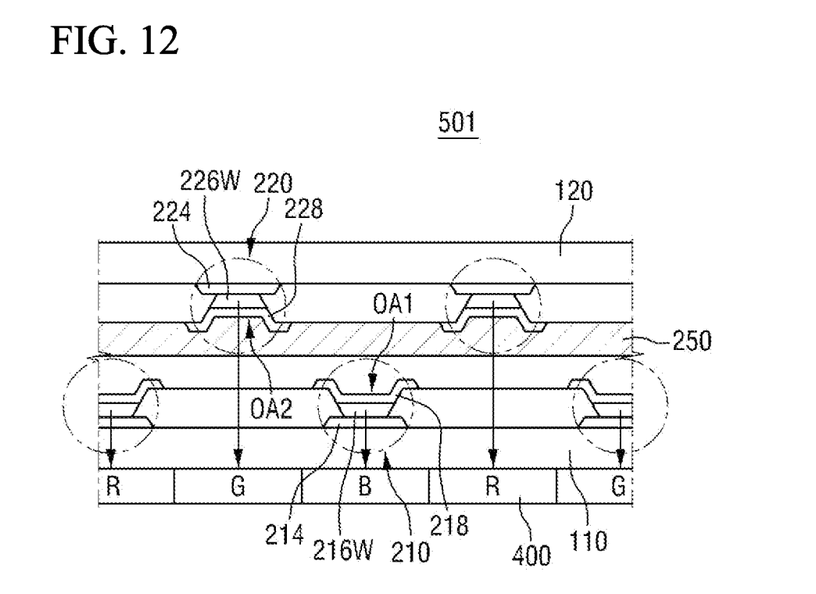
FIG. 12 is a partial cross-sectional view of a light emitting apparatus according to another embodiment of the present invention.

FIG. 12 is a partial cross-sectional view of a light emitting apparatus according to another embodiment of the present invention. Referring to FIG. 12, a light emitting apparatus 501 according to this embodiment is different from the embodiment of FIG. 3 in that a first light emitting layer 216w and a second light emitting layer 226w emit light of white (W). For this, the first light emitting layer 216w and the second light emitting layer 226w may be formed by laminating two or more light emitting layers. For example, the first light emitting layer 216w and the second light emitting layer 226w may be formed by laminating a red light emitting layer, a green light emitting layer, and a blue light emitting layer or by laminating a blue light emitting layer and a yellow light emitting layer.

In order to implement full colors, color filters 400 may be installed on a light emission path. In the drawing, it is exemplified that red (R), green (G), and blue (B) color filters 400 are formed on the lower surface of the substrate portion 110. However, the color filters may be formed on the upper surface of the substrate portion 110.

Figure 13:
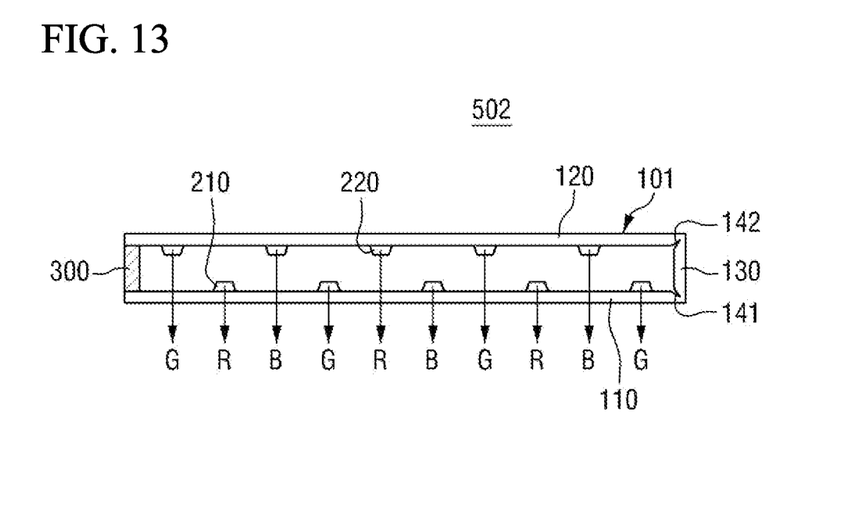
FIG. 13 is a schematic cross-sectional view of a light emitting apparatus according to still another embodiment of the present invention.

FIG. 13 is a schematic cross-sectional view of a light emitting apparatus according to still another embodiment of the present invention. Referring to FIG. 13, a light emitting apparatus 502 according to this embodiment is different from the embodiment of FIG. 2 in that a first bent surface 141 is formed on the boundary between the connection portion 130 and the first substrate portion 110 and a second bent surface 142 is formed on the boundary between the connection portion 130 and the second substrate portion 120. By providing the first bent surface 141 and the second bent surface 142, substantially the same configuration as that of FIG. 2 can be implemented even though the substrate is not flexible as a whole.

Figure 14:
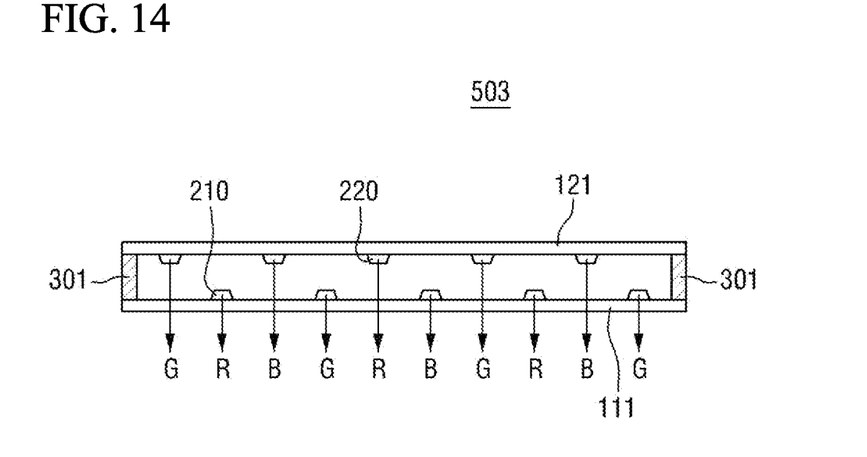
FIG. 14 is a schematic cross-sectional view of a light emitting apparatus according to still another embodiment of the present invention.

FIG. 14 is a schematic cross-sectional view of a light emitting apparatus according to still another embodiment of the present invention. Referring to FIG. 14, a light emitting apparatus 503 according to this embodiment is different from the embodiment of FIG. 2 in that the substrate is separated into a first substrate 111 and a second substrate 121. That is, in this embodiment, the substrate does not include the connection portion, and the first side part (see 100S1 in FIG. 1) that is the corresponding position is sealed by a sealing member 301.

The second light emitting elements 220 are formed on the lower surface of the second substrate 121 that faces the first substrate 111. Accordingly, the arrangement of the second light emitting elements 220 is substantially the same as that according to the embodiment of FIG. 2.

Figure 15:
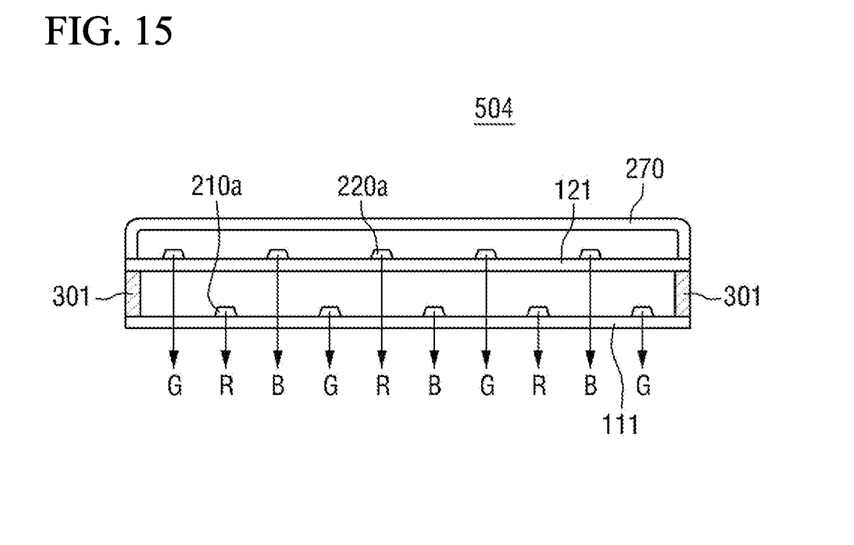
FIG. 15 is a schematic cross-sectional view of a light emitting apparatus according to still another embodiment of the present invention.
Figure 16:
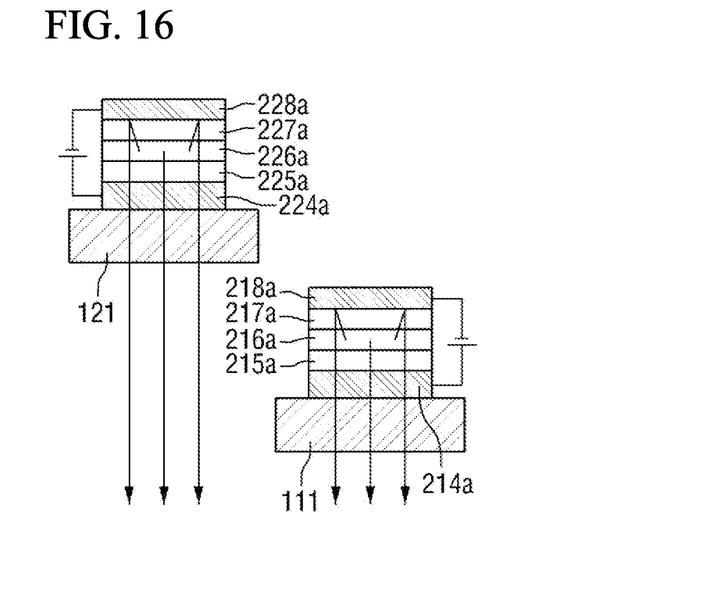
FIG. 16 is a schematic view of light emitting elements of the light emitting apparatus illustrated in FIG. 15.

FIG. 15 is a schematic cross-sectional view of a light emitting apparatus according to still another embodiment of the present invention. FIG. 16 is a schematic view of light emitting elements of the light emitting apparatus illustrated in FIG. 15. Referring to FIGS. 15 and 16, a light emitting apparatus 504 according to this embodiment is the same as the embodiment of FIG. 14 in that the substrate is separated into the first substrate 111 and the second substrate 121 and the first side part (see 100S1 in FIG. 1) is sealed by the sealing member 301 without the connection portion, but is different from the embodiment of FIG. 14 in that second light emitting elements 220a is formed on the upper surface of the second substrate 121 which is opposite to the lower surface that faces the first substrate 111.

More specifically, first light emitting elements 210a are formed on the upper surface of the first substrate 111 and the second light emitting elements 220a are formed on the upper surface of the second substrate 121. Even in this embodiment, the direction of the light emitted from the first light emitting elements 210a is equal to the direction of the light emitted from the second light emitting elements 220a. Accordingly, if the first light emitting elements 210a are rear surface light emitting elements whereby the light penetrates the first substrate 111 and is emitted to the lower portion, the second light emitting elements 220a may also be the rear surface light emitting elements whereby the light penetrates the second substrate 121 and is emitted to the lower portion.

Referring to FIG. 16, if an electric field is formed between the first lower electrode 214a and the first upper electrode 218a of the first substrate 111, a predetermined light is emitted from the first light emitting layer 216a. If the first upper electrode 218a is adopted as a reflective electrode and the first lower electrode 214a is adopted as a transparent electrode, the light may pass through the first substrate 111 and be emitted in the lower direction in the drawing.

In the same manner, if an electric field is formed between the second lower electrode 224a and the second upper electrode 228a of the second substrate 121, light is emitted from the second light emitting layer 226a. If the second upper electrode 228a is adopted as a reflective electrode and the second lower electrode 224a is adopted as a transparent electrode, the light may pass through the second substrate 121 and be emitted in the lower direction in the drawing.

Although not illustrated in FIG. 15, if the first light emitting elements 210a are front surface light emitting elements that emit light upward, the second light emitting elements 220a may also be the front surface light emitting elements.

Accordingly, in this embodiment, the electrode structures and the light emitting layer structures of the first light emitting elements 210a and the second light emitting elements 220a may be substantially the same.

On the second substrate 121, a capping film 270 that covers the second light emitting elements 220a may be formed. A protection substrate may be arranged instead of the capping film 270.

Figure 17:
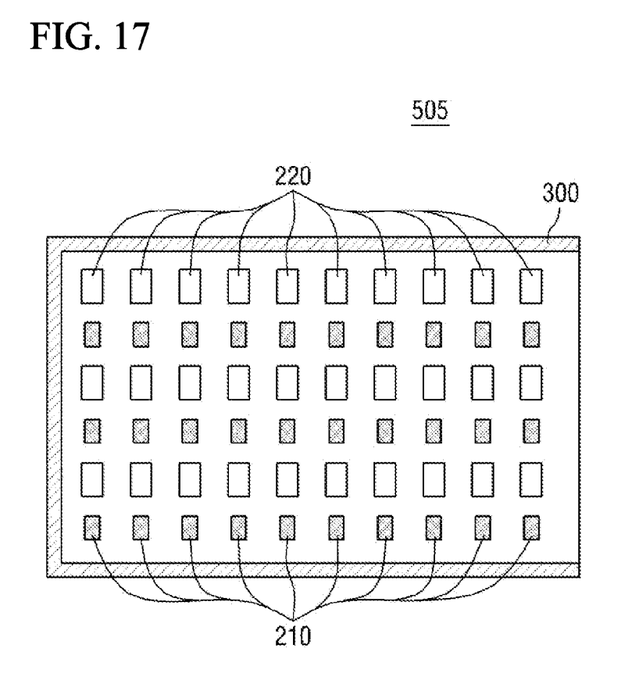
FIGS. 17 and 18 are schematic layout diagrams of a light emitting apparatus according to various embodiments of the present invention.
Figure 18:
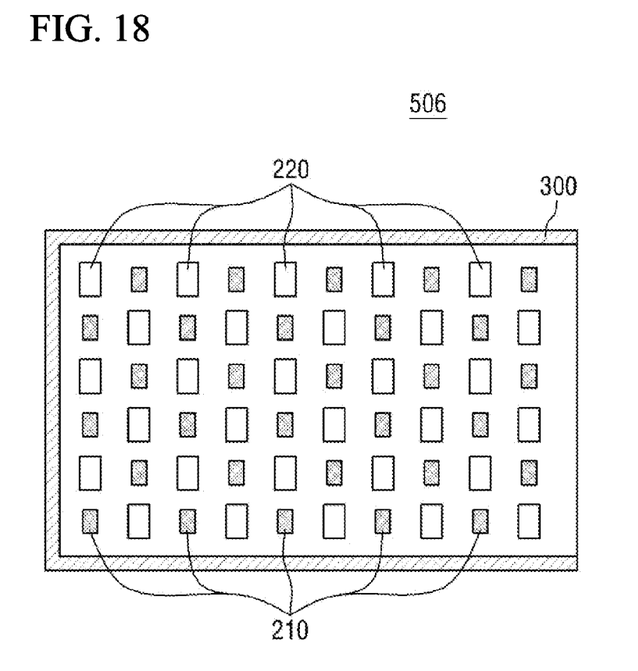

FIGS. 17 and 18 are schematic layout diagrams of a light emitting apparatus according to various embodiments of the present invention. FIGS. 17 and 18 show that the first light emitting elements 210 and the second light emitting elements 220 may have various matrices.

The light emitting apparatus 505 of FIG. 17 exemplifies that, if the matrix of the plurality of first light emitting elements 210 overlaps the matrix of the plurality of second light emitting elements 220, the columns of the matrix of the second light emitting elements 220 are arranged between the columns of the matrix of the first light emitting elements 210.

The light emitting apparatus 506 of FIG. 18 exemplifies that, if the columns of the first light emitting elements 210 and the second light emitting elements 220 are arranged to cross each other and to overlap each other, a square matrix is completed. Of course, other various modifications are possible.

Although preferred embodiments of the present invention have been described for illustrative purposes, those skilled in the art will appreciate that various modifications, additions and substitutions are possible without departing from the scope and spirit of the invention as recited in the accompanying claims.

What is claimed is:

1. A light emitting apparatus, comprising:
a continuous substrate folded into a first substrate portion, a second substrate portion arranged in parallel to the first substrate portion, and a connection intermediate portion connecting the first substrate portion and the second substrate portion to each other;
an array comprising a plurality of rows of first light emitting elements formed on the first substrate portion; and
a plurality of second light emitting elements formed on the second substrate portion staggered between the rows of the first light emitting elements.

2. The light emitting apparatus of claim 1, the plurality of first light emitting elements being formed on one surface of the first substrate portion that faces the second substrate portion, and the plurality of second light emitting elements being formed on one surface of the second substrate portion that faces the first substrate portion.

3. The light emitting apparatus of claim 2, a light emitting direction of the first light emitting elements and a light emitting direction of the second light emitting elements being equal to each other.

4. The light emitting apparatus of claim 2, each of the first light emitting elements being a rear surface light emitting element, and each of the second light emitting elements is a front surface light emitting element.

5. The light emitting apparatus of claim 2, each of the first light emitting elements including a first lower electrode, a first light emitting layer, and a first upper electrode; and
each of the second light emitting elements including a second lower electrode, a second light emitting layer, and a second upper electrode.

6. The light emitting apparatus of claim 5, the first lower electrode and the second upper electrode including a transparent conductive material; and
the first upper electrode and the second lower electrode including a reflective material.

7. The light emitting apparatus of claim 5, the first light emitting layer and the second light emitting layer being made of a same material.

8. The light emitting apparatus of claim 1, the connection portion connecting one side part of the first substrate portion and one side part of the second substrate portion to each other; and
said apparatus further comprising a sealing member disposed between the other side part of the first substrate portion and the other side part of the second substrate portion to seal between the first substrate portion and the second substrate portion.

9. The light emitting apparatus of claim 1, the substrate being a flexible substrate, and the connection portion including a curved surface that is curved outwardly convexly with respect to a region between the first substrate portion and the second substrate portion.

10. The light emitting apparatus of claim 1, further comprising:
a first bent surface formed between the first substrate portion and the connection portion; and
a second bent surface formed between the second substrate portion and the connection portion.

11. A light emitting apparatus, comprising:
a first substrate;
a second substrate arranged parallel to the first substrate;
an array comprising a plurality of rows of first light emitting elements formed on one surface of the first substrate that faces the second substrate; and
a plurality of second light emitting elements formed on another surface of the second substrate that faces the first substrate, staggered between the rows of the first light emitting elements, a light emitting direction of the first light emitting elements and a light emitting direction of the second light emitting elements being equal to each other.

12. The light emitting apparatus of claim 11, each of the first light emitting elements being a rear surface light emitting element, and each of the second light emitting elements being a front surface light emitting element.

13. The light emitting apparatus of claim 11, each of the first light emitting elements including a first lower electrode, a first light emitting layer, and a first upper electrode; and
each of the second light emitting elements including a second lower electrode, a second light emitting layer, and a second upper electrode.

14. The light emitting apparatus of claim 13, the first lower electrode and the second upper electrode including a transparent conductive material, and the first upper electrode and the second lower electrode including a reflective material.

15. The light emitting apparatus of claim 13, the first light emitting layer and the second light emitting layer being made of a same material.

16. A light emitting apparatus, comprising:
a first substrate;
a second substrate arranged in parallel to the first substrate;
an array comprising a plurality of rows of first light emitting elements formed on one surface of the first substrate that faces the second substrate; and
a plurality of second light emitting elements formed on one surface of the second substrate which is opposite to the other surface of the second substrate that faces the first substrate, staggered between the rows of the first light emitting elements;
a light emitting direction of the first light emitting elements and a light emitting direction of the second light emitting elements being equal to each other; and
the second light emitting elements being arranged to cross the first light emitting elements.

17. The light emitting apparatus of claim 16, the first light emitting element and the second light emitting element being one of rear surface light emitting elements and front surface light emitting elements.

18. A method for fabricating a light emitting apparatus, comprising the steps of:
preparing a substrate that is folded into a first substrate portion and a second substrate portion;
forming an array comprising a plurality of rows of first light emitting elements on the first substrate portion;
forming a plurality of second light emitting elements on the second substrate portion such that the second light emitting elements staggered between the rows of the first light emitting elements; and arranging the second substrate portion so that the second substrate portion faces the first substrate portion in parallel by folding a boundary between the first substrate portion and the second substrate portion.

19. The method for fabricating a light emitting apparatus of claim 18, the forming of the plurality of first light emitting elements including sequentially forming a first lower electrode, a first light emitting layer, and a first upper electrode;

the forming of the plurality of second light emitting elements including sequentially forming a second lower electrode, a second light emitting layer, and a second upper electrode; and the first light emitting layer and the second light emitting layer being simultaneously formed with the same material.

* * * * *